United States Patent
Kaneko et al.

(10) Patent No.: US 10,015,913 B2
(45) Date of Patent: Jul. 3, 2018

(54) POWER CONVERTER AND COOLER

(71) Applicant: FUJI ELECTRIC CO., LTD., Kawasaki-shi, Kanagawa (JP)

(72) Inventors: Kimihisa Kaneko, Yokohama (JP); Misato Shibata, Hino (JP); Yoshihisa Uehara, Hino (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/420,213

(22) Filed: Jan. 31, 2017

(65) Prior Publication Data
US 2017/0238441 A1    Aug. 17, 2017

(30) Foreign Application Priority Data

Feb. 15, 2016  (JP) .................................. 2016-026363
Dec. 2, 2016   (JP) .................................. 2016-235376

(51) Int. Cl.
   H05K 7/20     (2006.01)
   H01L 23/367   (2006.01)
   F28F 13/06    (2006.01)

(52) U.S. Cl.
   CPC ............. *H05K 7/209* (2013.01); *F28F 13/06* (2013.01); *H01L 23/3672* (2013.01)

(58) Field of Classification Search
   CPC ............... H01L 23/467; H01L 23/3672; H01L 23/3677; H01L 23/3735; H01M 10/613; H01M 10/625; F28D 1/05391; F28D 1/05366; F28D 2021/0094; F28D 2021/0029; F28D 2021/0082; F28F 1/128; F28F 3/025; F28F 1/022; F28F 1/126; F28F 3/02; F28F 1/32; F28F 3/022; F28F 9/002; F28F 17/005; F28F 9/001; F28F 1/40; F28F 3/12; F28F 9/0226; F28F 13/06; F28F 21/084; F28F 2215/04; F28F 3/048;
   (Continued)

(56) References Cited

U.S. PATENT DOCUMENTS

2007/0193730 A1*  8/2007  Ozaki ................ B60H 1/00321
                                                          165/140
2008/0074845 A1*  3/2008  Sun ...................... H01L 23/467
                                                          361/712

(Continued)

FOREIGN PATENT DOCUMENTS

JP    3469475 B2     11/2003
JP    2007-134471 A   5/2007
(Continued)

*Primary Examiner* — Adam B Dravininkas
(74) *Attorney, Agent, or Firm* — Rabin & Berdo, P.C.

(57) ABSTRACT

A power converter, including a heat generating element, and a cooler that includes a heat receiving plate, a plurality of cooling fins and a baffle plate. The heat generating element and the plurality of cooling fins are respectively mounted on two different surfaces of the heat receiving plate. Each cooling fin is a plate of a rectangular shape, and the plurality of cooling fins are arranged in parallel to one another, surfaces of any adjacent two of the cooling fins defining a course for cooling air to flow therethrough. The baffle plate is provided across the plurality of cooling fins, and has a substantially rectangular surface in a direction perpendicular to a direction of the courses.

17 Claims, 19 Drawing Sheets

(58) Field of Classification Search
CPC ........... F28F 2215/02; F28F 2009/0287; F28F 3/027; F28F 3/046; F28F 1/12; H02K 11/046; H02K 9/06; H02K 5/20; H02K 5/18; H05K 7/20254; H05K 7/209; H05K 3/0061; H05K 7/20509
See application file for complete search history.

(56) References Cited

U.S. PATENT DOCUMENTS

| | | | |
|---|---|---|---|
| 2010/0006261 A1* | 1/2010 | Ishida | B61C 17/00 165/86 |
| 2012/0012294 A1* | 1/2012 | Miki | B61C 17/00 165/185 |
| 2014/0076521 A1* | 3/2014 | Lin | F28D 15/0275 165/104.21 |
| 2015/0090435 A1* | 4/2015 | Xia | F28F 3/00 165/185 |
| 2015/0371920 A1* | 12/2015 | Kawaguchi | H05K 7/20918 361/704 |
| 2016/0229116 A1* | 8/2016 | Nakamura | B29C 66/91212 |

FOREIGN PATENT DOCUMENTS

| | | | | |
|---|---|---|---|---|
| JP | 2007134471 A | * | 5/2007 | ......... H05K 7/20918 |
| WO | WO 2010-109799 A1 | | 9/2010 | |

\* cited by examiner

VEHICLE TRAVELING DIRECTION
(TRAVELING-WIND FLOWING DIRECTION)

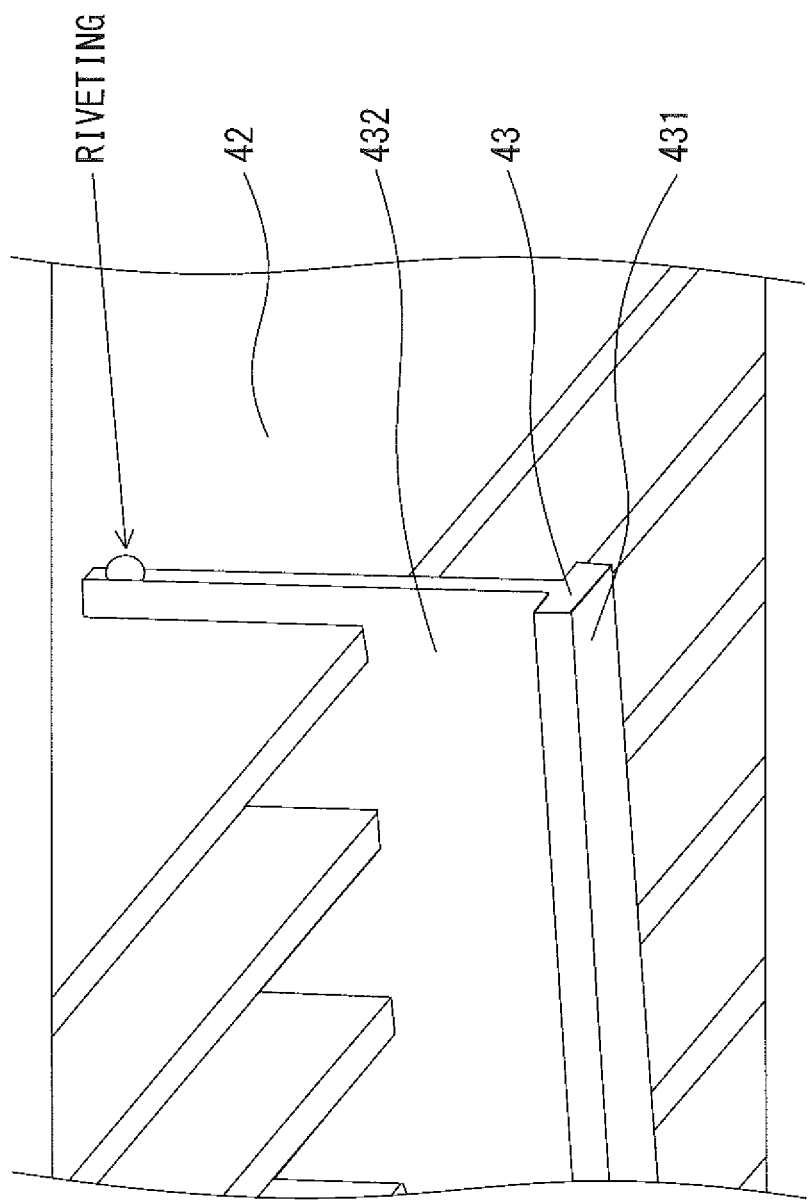

POWER CONVERTER AND COOLER

CROSS REFERENCE TO RELATED APPLICATION

This application is based upon and claims the benefit of priority of the prior Japanese patent applications No. JP2016-026363, filed on Feb. 15, 2016, and No. JP2016-235376, filed on Dec. 2, 2016, the entire contents of which are incorporated herein by reference.

TECHNICAL FIELD

The present disclosure relates to a cooling structure of a power converter that is able to maintain an amount of cooling air flowing between cooling fins.

BACKGROUND

Conventionally, in order to make it smaller and lighter and to realize less maintenance, a power converter provided in a railway vehicle uses a traveling-wind cooling approach that blows a traveling wind to heat dissipating fins of a cooling body so as to perform cooling, wherein the cooling body cools a power unit constituted of, for example, a semiconductor element and the traveling wind is generated due to a vehicle traveling.

FIG. 1 illustrates an exemplary configuration of a cooler of a power converter disclosed in Patent Document 1 below, wherein a baffle plate 20 having a mountain-shaped cross section is provided inside a protection cover 19 of a cooler 1 and openings are provided in the protection cover 19 as appropriate so as to intake cooling air (see the curved arrows) from the openings.

A cooler 1u situated in the middle of a plurality of coolers 1 that are arranged side by side is smaller than the adjacent coolers 1 situated on both sides of the cooler 1u (the height of its heat dissipating fins is smaller), wherein the height of heat dissipating fins of the cooler 1u situated in the middle portion is made smaller than the heights of heat dissipating fins situated in the other portion, along the convexity of the baffle plate 20 having a mountain-shaped cross section and being provided inside the protection cover 19.

Such a configuration makes it possible to perform a traveling-wind cooling using a last cooler 1 efficiently because the baffle plate 20 is oriented (slopes) appropriately with respect to the last cooler 1 such that a wind from the left direction (illustrated), that is, a wind from the traveling direction (a traveling wind) is directed to the last cooler 1 situated in a position where it is most difficult for the traveling wind to reach and because the cooler 1u situated just before the last cooler 1u is smaller (the height of its heat dissipating fins is smaller), so the traveling wind whose direction has been changed due to the slope of the baffle plate 20 can easily enter into the last cooler 1.

FIGS. 2A to 2C and 3 are diagrams that illustrate a cooling structure of a power converter for a railroad vehicle disclosed in Patent Document 2 below, wherein a plurality of semiconductor modules 2 that constitute a power unit are thermally conductively placed on the upper surface of a planar substrate (a heat receiving plate) 11 of a cooling body 1, and a plurality of thin planar heat dissipating fins 12 are installed parallel to one another on its lower surface at a predetermined spacing, the substrate being made of highly heat-conductive material.

FIG. 3 illustrates a structure of a fin holding plate described in FIGS. 2A and 2C, and in FIG. 3, a fin holding plate 33 is provided with convexities 33b that each enter into a space between two heat dissipating fins of the cooling body, wherein the fin holding plate 33 has slopes at both end portions situated in a front and rear in a vehicle traveling direction, and its central portion has a trapezoidal shape.

In the example of FIGS. 2A to 2C, the planar fin holding plate 33 is provided across the ends of the heat dissipating fins 12 of the cooling body 1 (in the lower end portion in FIG. 2B) in a width direction of the substrate 11 (in the vertical direction in FIG. 2A) and is coupled to the heat dissipating fins 12 by, for example, brazing, so as to bring together all of the heat dissipating fins.

For example, as can be seen from FIG. 3, when the fin holding plate 33 is coupled to the ends of the heat dissipating fins 12, each of the ends of the heat dissipating fins 12 is partially inserted into a slit 33c between two convexities 33b of the fin holding plate 33 and attached to a flat portion 33a, and the attached portions are coupled by, for example, metal brazing, so as to bring together a plurality of heat dissipating fins 12 using the fin holding plate 33.

As illustrated in FIG. 2B, a fin holding plate 33 is provided at each of the following three points: at the front end, in the middle, and at the rear end in a length direction of the heat dissipating fins 12 (in a travelling-wind flowing direction).

When the ends of the heat dissipating fins 12 are brought together using the fin holding plates 33, a wind adjusting effect is produced due to the fin holding plates 33 being situated side by side in the traveling-wind flowing direction.

Specifically, each of the fin holding plates 33 prevents a traveling wind generated due to a vehicle traveling from flowing out to outside the heat dissipating fins, and the traveling wind flows with its flow rate being increased due to the convexities 33b of the fin holding plate 33.

The traveling wind flowing outside the heat dissipating fins 12 is intaken into spaces between the heat dissipating fins from between the fin holding plates 33 at the front end and in the middle and from between the fin holding plates 33 in the middle and at the rear end, so as to flow between the heat dissipating fins, which makes it possible to provide a cooling effect more uniformly throughout the entire length of the substrate 11 of the cooling body 1 and to prevent an increase in the temperature in a position downstream of a traveling wind (on the rear-end side) in the substrate 11.

There has been a problem in which, in the technology disclosed in Patent Document 1 above, an internal flow resistance is increased due to the protection cover, which results in difficulty in intaking sufficient cooling air.

Further, there has been a problem in which the technology disclosed in Patent Document 2 above permits an intake of cooling air through a fin holding plate so as to provide a cooling effect uniformly, but it is not possible to intake a traveling wind between the fins while traveling at a low speed, which results in not obtaining a sufficient cooling effect.

Patent Document 1: Japanese Patent No. 3469475 (FIG. 21)

Patent Document 2: Japanese Laid-open Patent Publication No. 2007-134471 (FIGS. 9 and 10)

DISCLOSURE OF INVENTION

An aspect of the present disclosure is to provide a power converter that is able to intake cooling air effectively between cooling fins.

A power converter is provided that includes a cooler including a heat receiving plate, wherein a heat generating element is mounted on one surface of the heat receiving plate and a plurality of cooling fins are mounted on the other surface, wherein the cooling fin is a rectangular-plate-shaped fin that has a surface along a course in which cooling air flows, and a plurality of cooling fins are arranged parallel to one another in a direction perpendicular to the flow of cooling air, the cooler further includes a first baffle plate that is provided across the plurality of cooling fins from one outermost cooling fin to another outermost cooling fin, and the first baffle plate has a substantially rectangular surface in a direction perpendicular to the flow of cooling air.

Further, the first baffle plate has an I-shaped or T-shaped cross section.

When a plurality of coolers are arranged in a direction in which cooling air flows, a second baffle plate is arranged between the coolers.

Embodiments of the present disclosure make it possible to push low-temperature air in a direction of the base of the cooling fins using a dynamic pressure of cooling air effectively.

Accordingly, a decrease in an amount of cooling air flowing between cooling fins is prevented and air whose temperature is lower than that of air flowing between cooling fins is intaken, which makes it possible to prevent a decrease in the cooling performance of the cooling fins.

Further, according to the embodiments of the present disclosure, the first baffle plate is fixed on outermost cooling fins by, for example, brazing, which makes it possible to prevent a cooling fin from falling off.

BRIEF DESCRIPTION OF DRAWINGS

FIGS. 12A and 12B are diagrams that illustrate the method for providing the first baffle plate (Part 2).

DESCRIPTION OF EMBODIMENTS

Embodiments of the present disclosure will now be described in detail with reference to the drawings.

Figure 1:
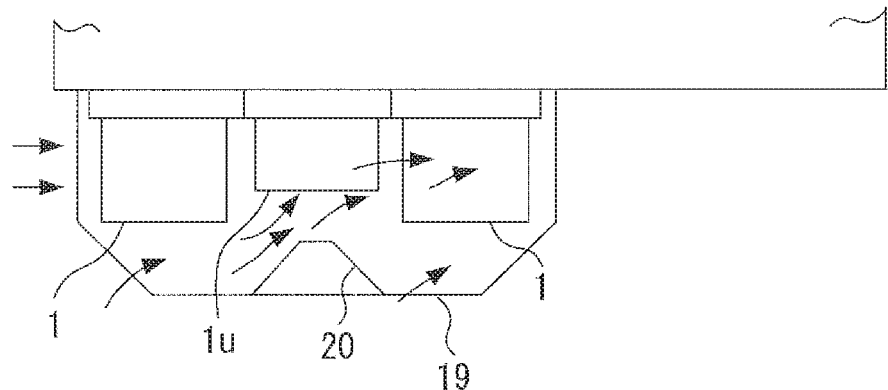
FIG. 1 illustrates a cooling structure of a power converter disclosed in Patent Document 1.
Figure 2A:
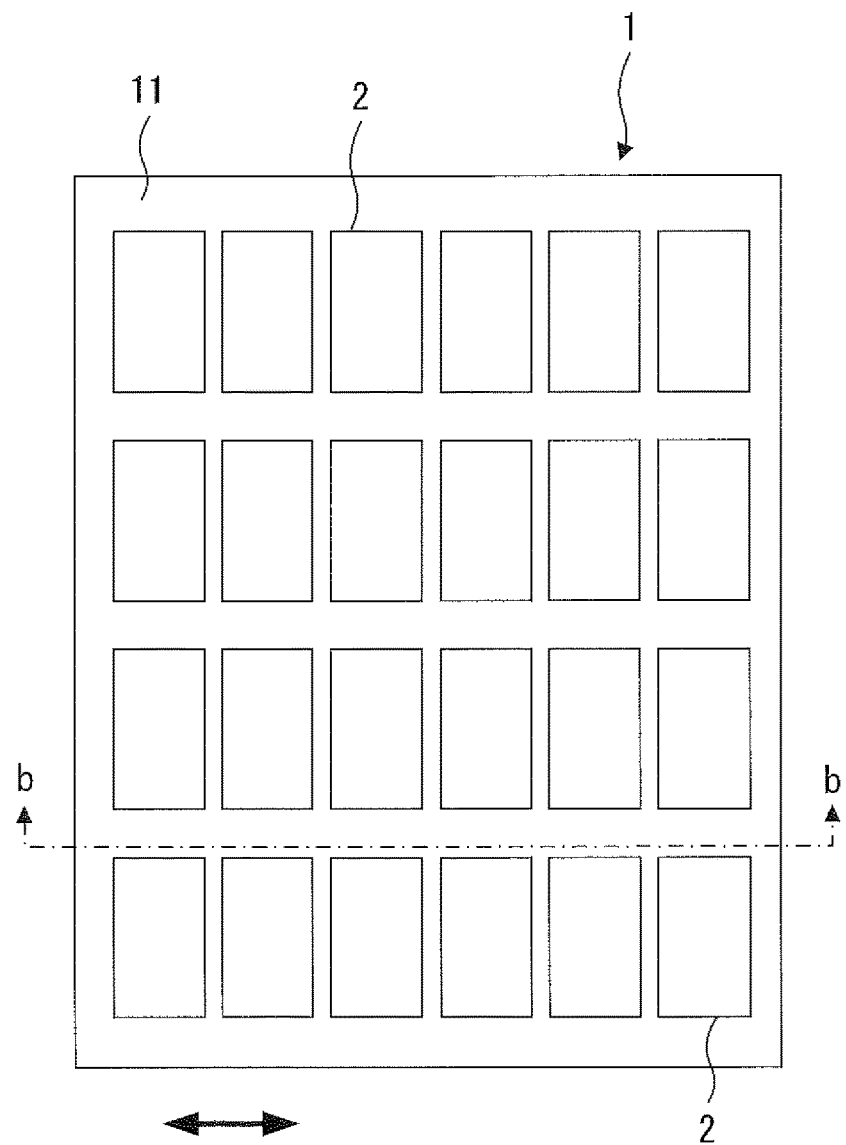
FIGS. 2A to 2C are diagrams that illustrate a cooling structure of a power converter for a railroad vehicle disclosed in Patent Document 2.
Figure 2B:
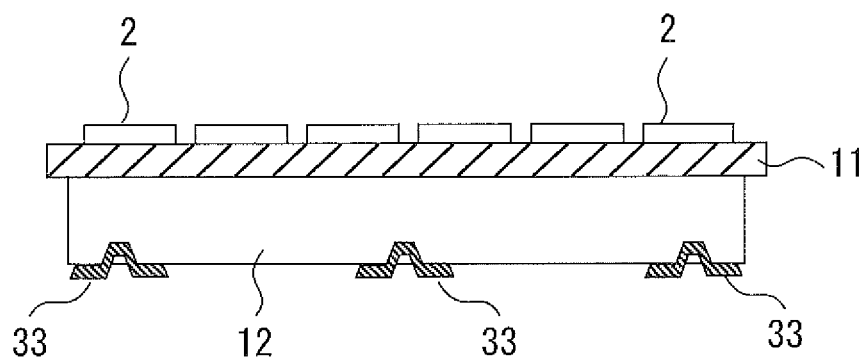
Figure 2C:
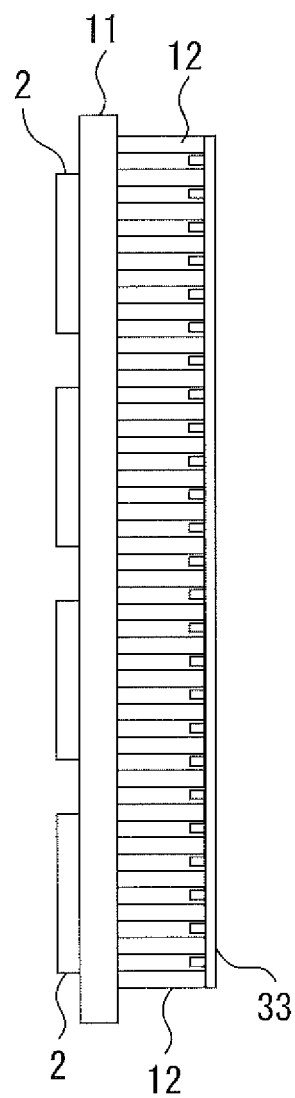
Figure 3:
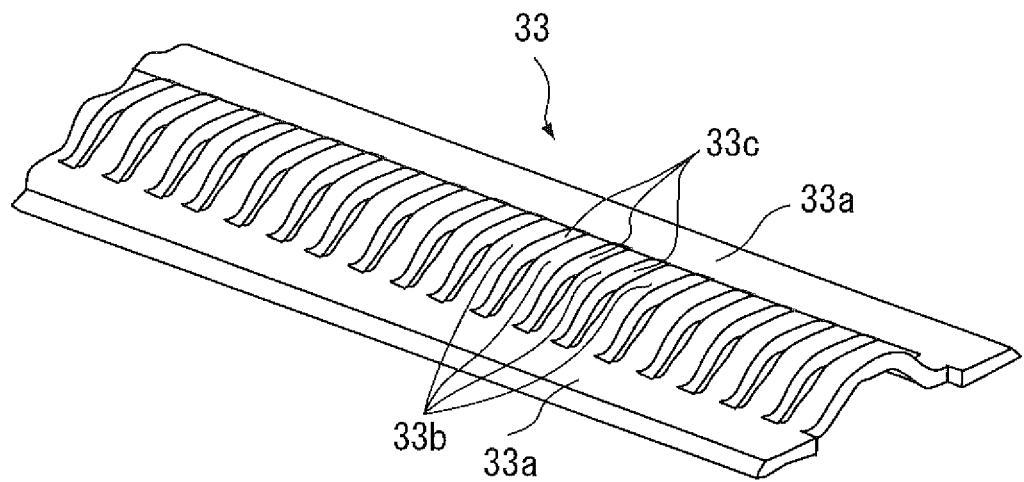
FIG. 3 illustrates a structure of a fin holding plate illustrated in FIGS. 2A to 2C.
Figure 4:
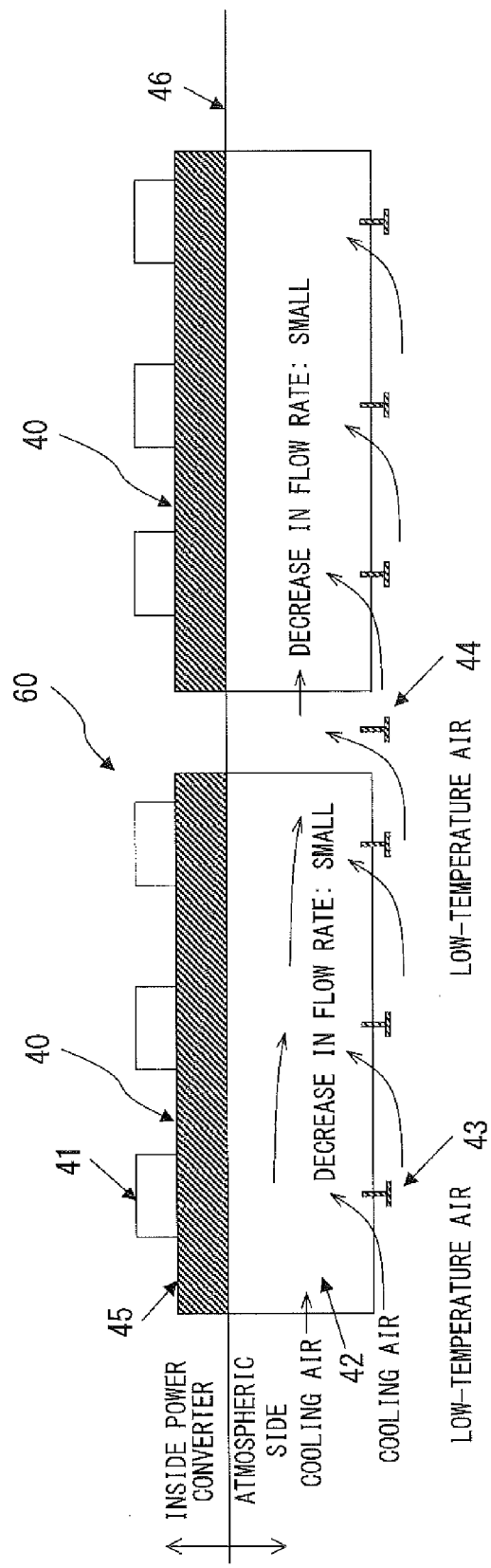
FIG. 4 is a diagram that illustrates how cooling air flows into a cooler (with a baffle plate) of a power converter according to embodiments of the present disclosure.
Figure 5:
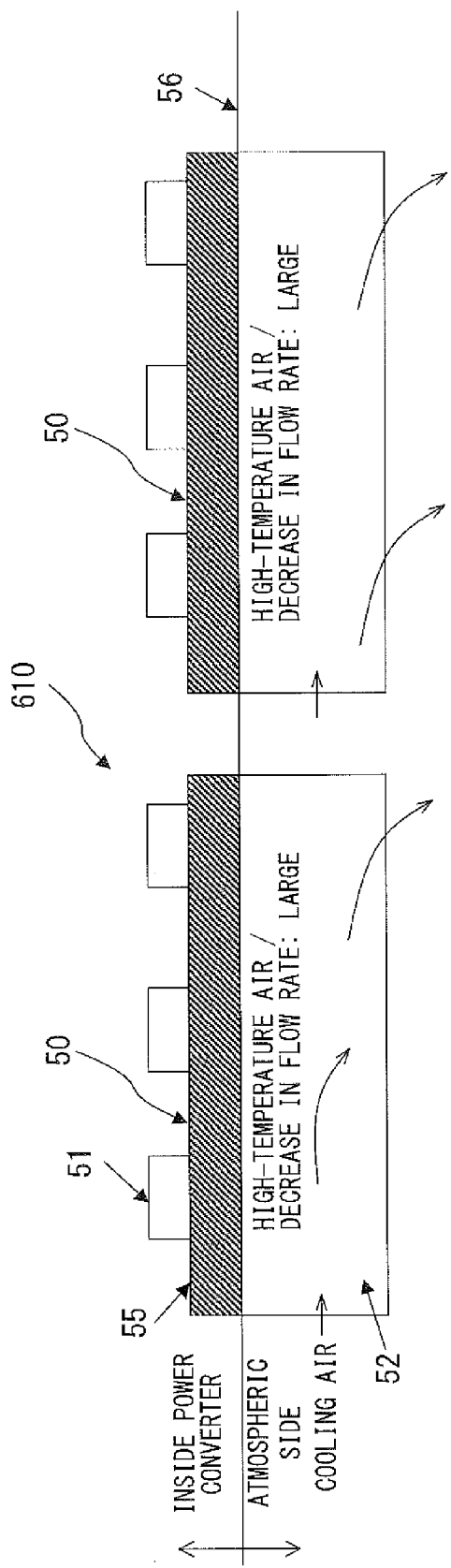
FIG. 5 is a diagram that illustrates how cooling air flows into a cooler (without a baffle plate) of a power converter that is used conventionally.

FIG. 4 is a diagram that illustrates a flow of cooling air in a cooler 40 (with a baffle plate) of a power converter 60 according to embodiments of the present disclosure. FIG. 5 is a diagram that illustrates a flow of cooling air in a cooler 50 (without a baffle plate) of a power converter 610 that is used conventionally.

The cooler 40 illustrated in FIG. 4 is constituted of a heat receiving plate 45 and a plurality of cooling fins 42, wherein a semiconductor element 41 is mounted on one surface of the heat receiving plate 45 and the plurality of cooling fins 42 are mounted on the other surface, and the cooler 50 illustrated in FIG. 5 is constituted of a heat receiving plate 55 and a plurality of cooling fins 52, wherein a semiconductor element 51 is mounted on one surface of the heat receiving plate 55 and the plurality of cooling fins 52 are mounted on the other surface.

The cooling fin 42 and the cooling fin 52 are rectangular-plate-shaped fins that each have a surface along a course in which cooling air flows. A plurality of cooling fins 42 are arranged parallel to one another in a direction perpendicular to the flow of cooling air, and a plurality of cooling fins 52 are arranged parallel to one another in a direction perpendicular to the flow of cooling air (see FIGS. 6A to 6D).

In each of the figures, two coolers 40 or 50 that each have such a configuration are arranged along the course in which cooling air flows. Further, in each of the figures, the cooler 40 or 50 is mounted on a bottom surface 46 or 56 of the power converter 60 or 610 such that the cooling fins 42 or 52 protrude below the power converter 60 or 610 (into an atmospheric side). The flow of cooling air that flows between the cooling fins 42 of the power converter 60 according to the embodiments of the present disclosure is described below, in a comparison between the cooling fins 42 and the cooling fins 52.

In the cooler 50 (without a baffle plate) of the conventionally used power converter 610 of FIG. 5, a baffle plate is not provided in the cooling fins 52. Thus, cooling air that flows between the cooling fins 52 is subject to a high flow-path resistance, and a flow-path resistance is decreased below the cooling fins 52 (on the atmospheric side).

Thus, a portion of cooling air that is flowing between the cooling fins 52 on the windward side is more likely to flow out below the cooling fins 52 (into the atmospheric side) toward the leeward side.

As a result, an amount of cooling air that passes through the cooling fins 52 on the windward side is reduced, which results in decreasing the cooling performance of the cooling fins 52 on the windward side. Likewise, an amount of cooling air that passes through the cooling fins 52 on the leeward side is also reduced. Thus, the cooling performance of the cooling fins 52 on the leeward side is also decreased. A baffle plate is not provided between the two coolers 50.

Cooling air that has passed through the cooling fins 52 on the windward side is also subject to a high flow-path resistance between the two coolers 50.

Thus, a portion of cooling air that has passed through the cooling fins 52 on the windward side flows out into the atmospheric side before it flows between the cooling fins 52 on the leeward side. Therefore, an amount of cooling air that flows between the cooling fins 52 on the leeward side is further reduced, which results in decreasing the cooling performance of the cooling fins 52 on the leeward side, compared with the cooling performance of the cooling fins 52 on the windward side.

Further, a baffle plate is not provided in the cooling fins 52, so cooling air that is flowing between the cooling fins 52 is more likely to flow out below (into the atmospheric side) toward the leeward side due to a flow-path resistance between the cooling fins 52.

The temperature of cooling air that passes through the cooling fins 52 on the windward side is increased due to heat of the semiconductor element 51. The cooling air whose temperature has been increased flows between the cooling fins 52 on the leeward side. This results in further decreasing the cooling performance of the cooling fins 52 arranged on the leeward side.

On the other hand, in the cooler 40 (with a baffle plate) of the power converter 60 according to the embodiments of the present disclosure in FIG. 4, a baffle plate 43 (a first baffle plate) is provided at the ends of the cooling fins 42. A baffle plate 44 (a second baffle plate) is provided on the bottom surface of the power converter 60 between the two coolers 40.

As described later, the baffle plate 43 and the baffle plate 44 each have a substantially rectangular surface that is perpendicular to a flowing direction of the cooling air. This surface protrudes below the ends of the cooling fins 42 (into the atmospheric side).

Thus, as indicated by the flow of cooling air illustrated in FIG. 4 (see the curved arrows), a portion of air that is flowing outside the cooling fins 42 will be directed between the cooling fins 42 by the baffle plate 43.

In other words, a portion of air that is flowing outside the cooling fins 42 rises along the surface of the baffle plate 43, and becomes cooling air that flows between the cooling fins 42. Further, this airflow prevents cooling air that is flowing between the cooling fins 42 from flowing out to outside the cooling fins 42.

Further, the presence of the baffle plate 44 between the coolers 40 permits a portion of air that is flowing outside to be directed to a cooler 40 situated on the leeward side.

In other words, a portion of air that is flowing outside the cooling fins 42 on the windward side rises along the surface of the baffle plate 44, and becomes cooling air that flows between the cooling fins 42 on the leeward side.

Further, this airflow makes it possible to lead, to the cooling fins 42 on the leeward side, a large portion of cooling air that has passed between the cooling fins 42 on the windward side.

As described above, using a dynamic pressure of cooling air effectively, the baffle plates 43 and 44 are able to prevent a reduction in cooling air that flows between the cooling fins 42 and to intake low-temperature air between the cooling fins 42.

Therefore, the power converter 60 including the baffle plates 43 and 44 is able to prevent a decrease in the cooling performance of the cooling fins 42.

The baffle plate 43 is provided across a plurality of cooling fins 42 from one outermost cooling fin to another outermost cooling fin, which makes it possible to prevent a cooling fin 42 from falling off.

In the example of FIG. 4, the position of a baffle plate 43 corresponds to a position in which a semiconductor element 41 is arranged, but this is just an example, and it does not have to correspond to the position in which a semiconductor element 41 is arranged.

In the examples of FIGS. 4 and 5, the semiconductor element 41 and the semiconductor element 51 that are mounted on the heat receiving plate 45 and the heat receiving plate 55, respectively, are examples of heat generating components. The heat generating component mounted on the heat receiving plate 45 or 55 is not limited to a semiconductor element, and may be an electric component, such as a resistor or a capacitor, which generates heat when energized.

Further, in the example of FIG. 5, the cooler 50 is mounted on the bottom surface 56 of the power converter 610, and is arranged such that the cooling fins 52 protrude below the power converter 610.

However, the embodiments of the present disclosure are not limited to the case in which the cooling fins 42 are arranged to protrude below the power converter 60, but the cooling fins 42 may be arranged to protrude laterally to or above the power converter 60.

In this case, low-temperature air lateral to or above the cooling fins 42 is directed between the cooling fins 42 by providing the baffle plate 43. This will also be described later.

FIGS. 6A to 6D are diagrams that explain how coolers and baffle plates are provided in the power converter according to a first embodiment of the present disclosure.

Figure 6A:
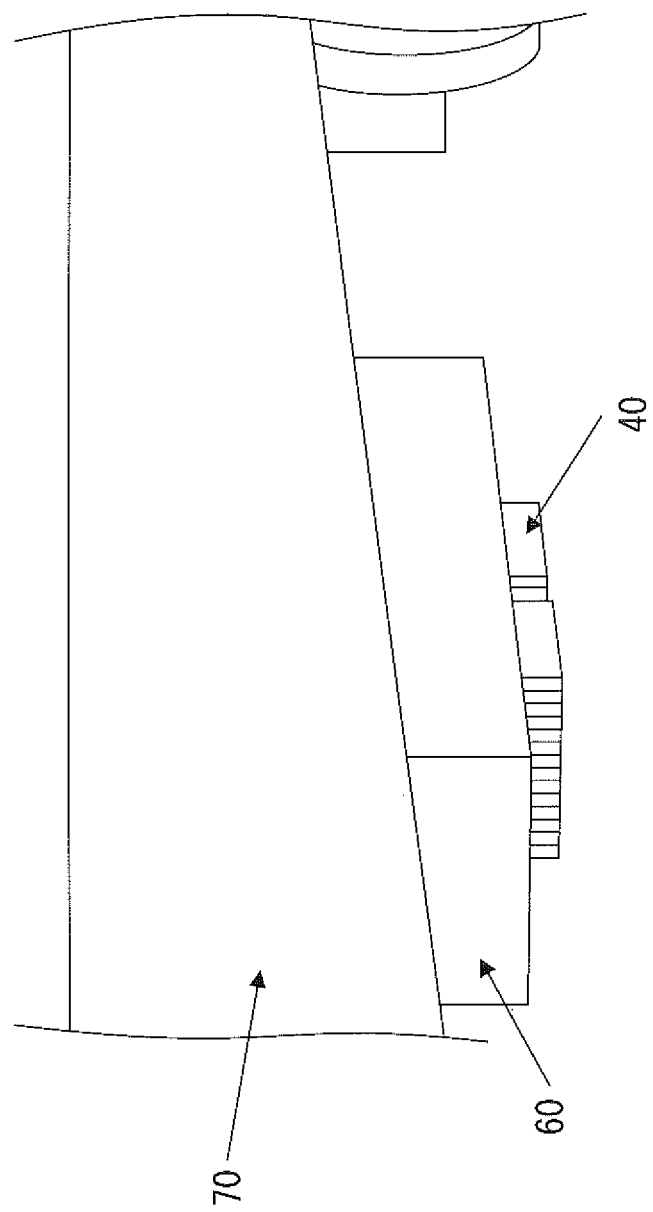
FIGS. 6A to 6D are diagrams that illustrate how coolers and baffle plates are provided in the power converter according to a first embodiment of the present disclosure.

FIG. 6A is a perspective view of an exemplary configuration in which two coolers 40 are mounted under the power converter 60 that is arranged under the floor of a railroad vehicle and accommodated in a rectangular-parallelepiped-shaped housing. The two coolers 40 are arranged along a course in which cooling air flows, and the cooling fins 42 of each of the coolers protrude from the lower part of the power converter 60 into the atmospheric side. The upper surface of the housing is provided on the lower surface of a vehicle body 70.

Figure 6B:
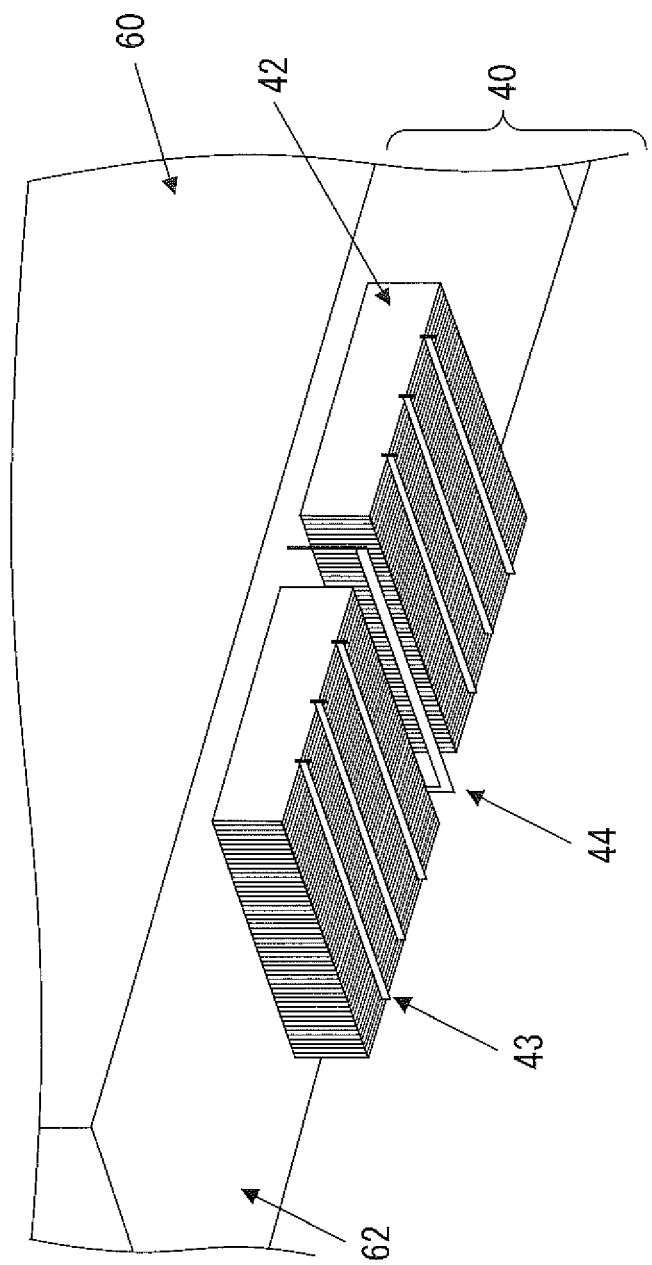

FIG. 6B is an enlarged perspective view that illustrates how the cooler 40 of FIG. 6A is mounted, as viewed from below so as to see the cooling fins 42, in contrast to the view of FIG. 6A.

The cooler 40 of the power converter 60 is provided with the baffle plate 43 (the first baffle plate). The baffle plate 44 (the second baffle plate) is provided between two coolers 40. The cooling fins 42 are mounted on the other surface of the heat receiving plate 45 (see FIG. 4) by, for example, swaging or brazing.

Figure 6C:
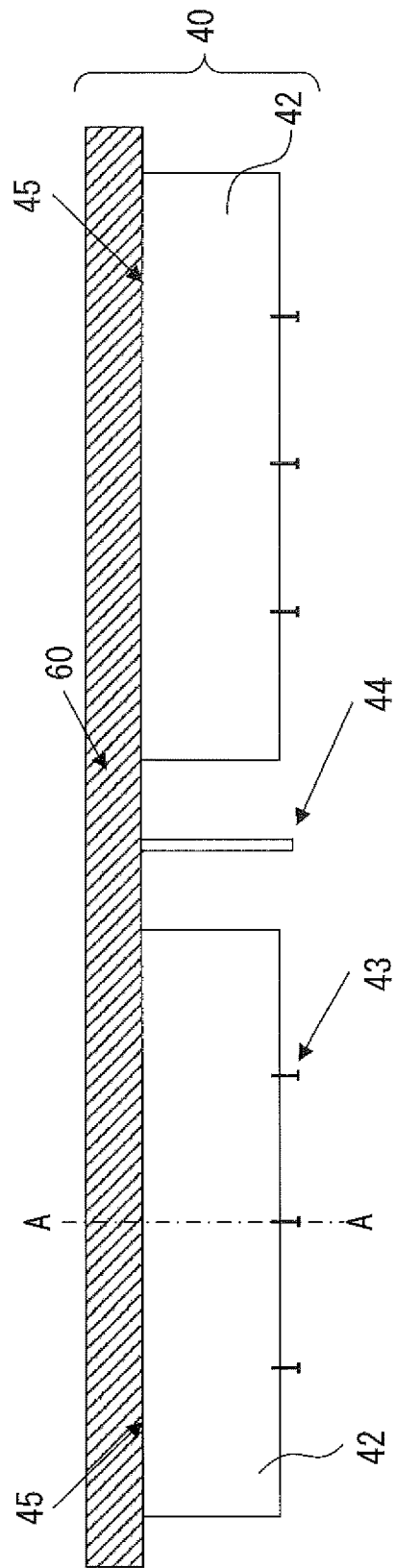

FIG. 6C is a front view of a configuration of the cooling fins 42 and the baffle plates 43 and 44 illustrated in FIG. 6B. The two coolers 40 that each include the cooling fins 42 are mounted on the heat receiving plate 45 along a course in which cooling air flows, the heat receiving plate 45 being provided under the power converter 60. The cooling fin 42 is a rectangular-plate-shaped fin.

The baffle plate 43 that has a T-shaped cross section is provided in the cooling fins 42, and the baffle plate 44 is provided between the respective cooling fins 42 of the two coolers 40. The end of the baffle plate 44 is situated below the ends of the cooling fins 42 (on the atmospheric side).

In FIG. 6C, three baffle plates 43 are provided in cooling fins 42 of each cooler, but as described above, the number of baffle plates 43 provided in the cooling fins 42 is just an example, and it is not limited to this example.

Figure 6D:
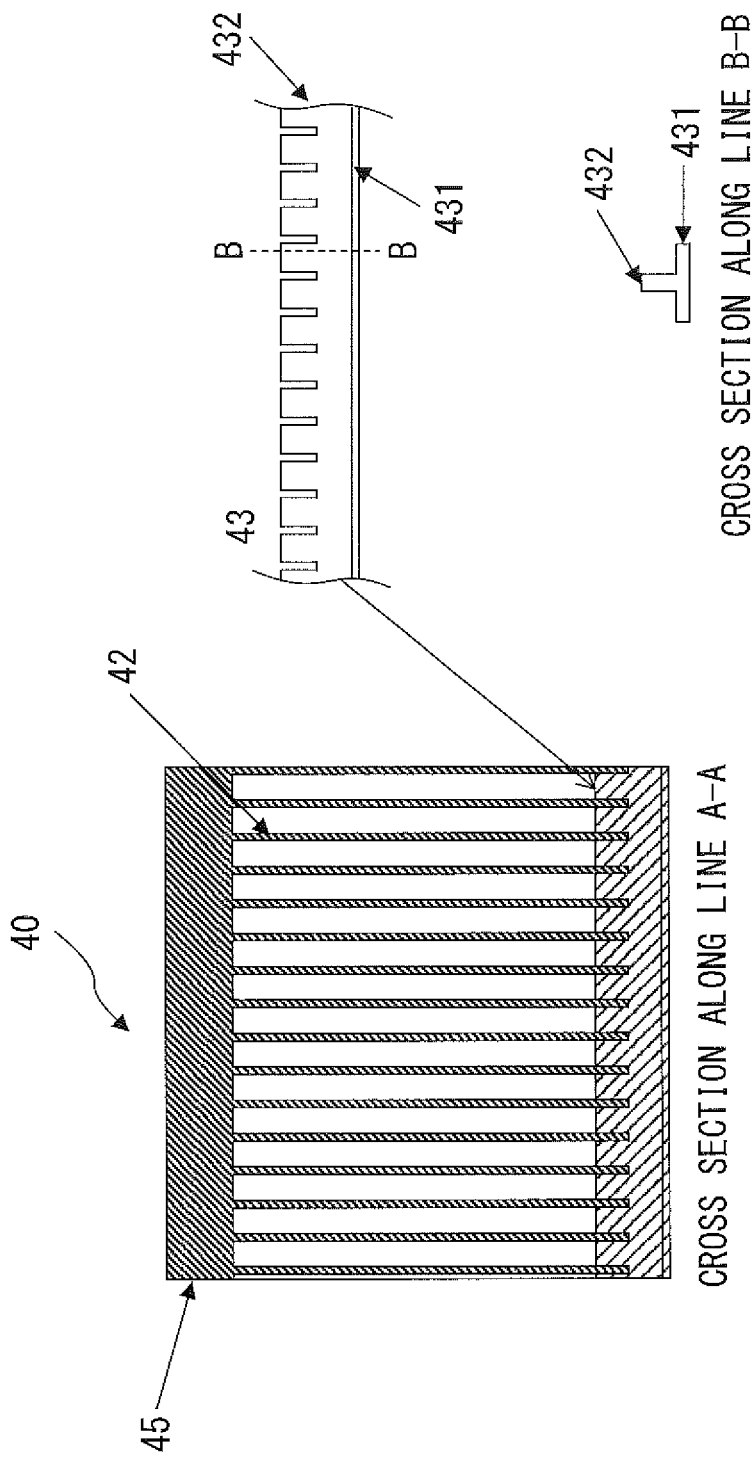

FIG. 6D is a side view of a configuration of the cooling fin 42 and the baffle plate 43, as viewed in the cross section along line A-A of FIG. 6C. On its right side, FIG. 6D illustrates a configuration of the baffle plate 43 and a cross-sectional view along line B-B of this configuration.

A plurality of cooling fins 42 are mounted at a predetermined spacing on the other surface of the heat receiving plate 45. The baffle plate 43 is provided across the plurality of cooling fins 42 from one outermost cooling fin to another outermost cooling fin.

The cross section along line B-B of the baffle plate 43 has a T shape that is constituted of a top part 431 and a leg part 432 of the T.

One end of the leg part 432 of the T (a rectangular surface hit by cooling air) of the baffle plate 43 is comb-shaped. Each of the ends of the cooling fins 42 fits a slit between teeth of the comb, and both ends of the baffle plate 43 are respectively fixed on outermost cooling fins 42.

The top part 431 of the T is mounted on the other end of the leg part 432 of the T, and an arrangement is made such that a portion of the leg part 432 and the top part 431 of the T protrude below the cooling fins 42 (into the atmospheric side).

The example has been described above in which the baffle plates 43 and 44 are provided in the cooling fins 42 that protrude under the power converter 60 that is arranged under the floor of the railroad vehicle and accommodated in the rectangular-parallelepiped-shaped housing, so as to lead cooling air effectively between cooling fins 42 has been described above. This makes it possible to lead low-temperature air in a direction of the base of the cooling fins 42.

As described above, the upper part of the power converter 60 that is arranged under the floor of the railroad vehicle and accommodated in the rectangular-parallelepiped-shaped housing, is mounted on the other surface of the heat receiving plate 45 (see FIG. 4) by, for example, swaging or brazing, the heat receiving plate 45 being provided in the power converter 60.

Figure 7:
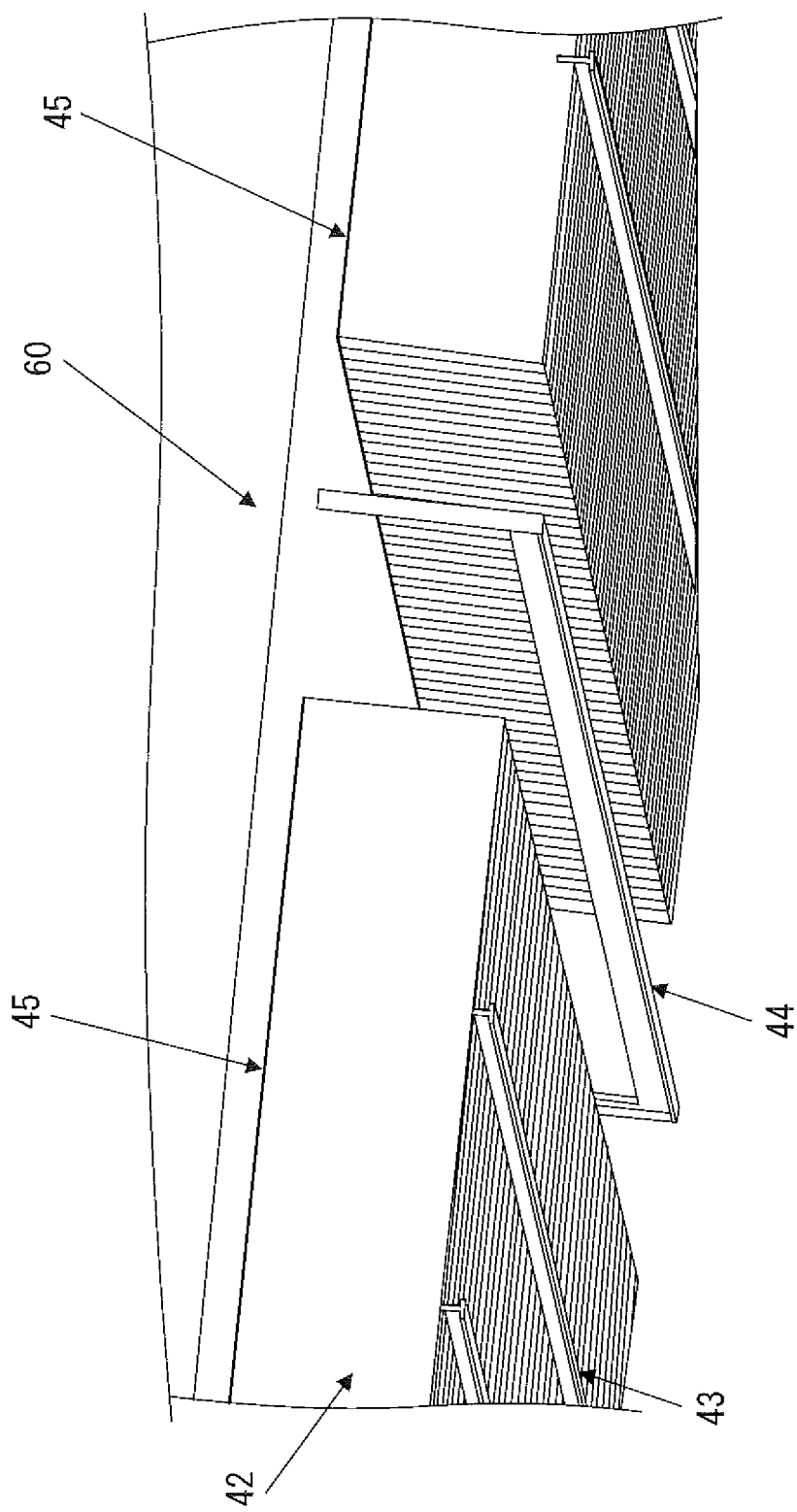
FIG. 7 is an enlarged perspective view of a configuration of a first baffle plate and a second baffle plate according to the first embodiment of the present disclosure.

FIG. 7 is an enlarged perspective view of a configuration of the baffle plate 43 and the baffle plate 44 according to the first embodiment of the present disclosure.

As illustrated, the surface of the baffle plate 43 which is hit by cooling air has a T-shaped or I-shaped cross section (described later). Further, as indicated on the right side of FIG. 6D, the end of the leg part 432 of the T is comb-shaped such that each of the ends of the cooling fins 42 fits a slit between teeth of the comb. A method for fixing the baffle plate 43 and its enlarged configuration will be described later.

The baffle plate 44 is C-shaped in overall shape, and an opened side of the C is fixed on the bottom surface of the power converter 60, that is, a bottom surface 62 of the housing, by, for example, welding, brazing, or screwing. The cross section of the baffle plate 44 is T-shaped similarly to the cross section of the baffle plate 43.

Figure 8:
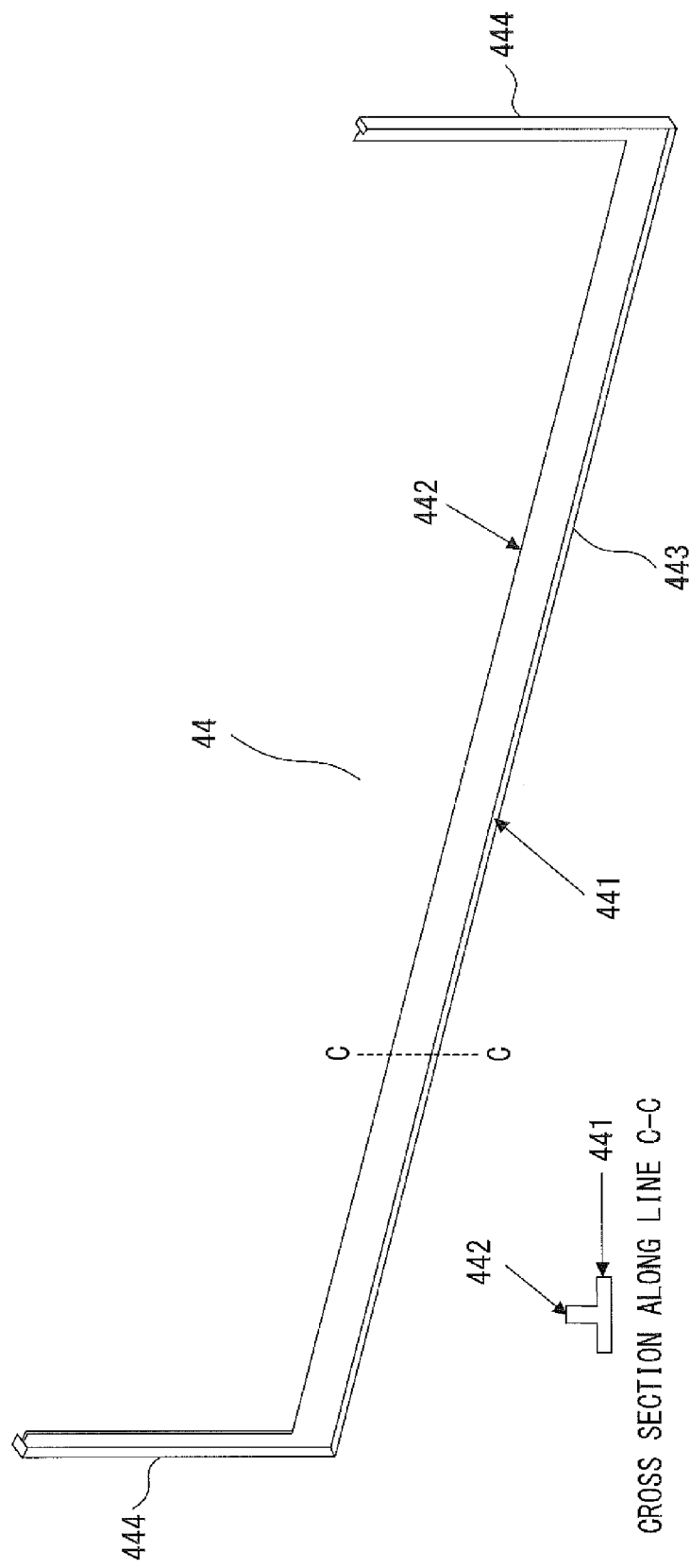
FIG. 8 is an enlarged view of a configuration of the second baffle plate according to the first embodiment of the present disclosure.

FIG. 8 is an enlarged view of a configuration of the baffle plate 44 according to the first embodiment of the present disclosure. Cross-sections of three sides of the C-shaped baffle plate 44 each have a T shape (a convex shape) that is constituted of a top part 441 and a leg part 442 of the T, as indicated by the cross section along line C-C in FIG. 8.

The leg part 442 of the T of each of the sides of the baffle plate 44 extends from the top part 441 of the T to the inside of the C-shaped baffle plate 44. A base 443 of the baffle plate 44 is parallel to the bottom surface of the power converter 60, that is, the bottom surface 62 of the housing, and has a rectangular surface in a direction perpendicular to a flow of cooling air.

The base 443 of the baffle plate 44 is configured such that the top part 441 of its T is situated outside the ends of the cooling fins 42 (on the atmospheric side) and the leg part 442 of its T extends above the ends of the cooling fins 42 from the top part 441 of its T.

In other words, the baffle plate 44 is arranged such that the surface of its base 443, the leg part 442 of the T, is perpendicular to cooling air and the top part 441 of the T is situated outside the cooling fins 42.

As illustrated in FIG. 4, when a railroad vehicle is traveling, cooling air that has passed through the cooling fins 42 situated on the windward side of the cooling air hits the leg part 442 of the T of the base 443 of the baffle plate 44 so as to be directed between the cooling fins 42 situated on the leeward side. Cooling air that has passed through an outside of the cooling fins 42 situated on the windward side of the cooling air hits the baffle plate 44 so as to be directed between the cooling fins 42 situated on the leeward side.

It is sufficient if at least the base of the baffle plate 44 has a T-shaped cross section. As described above, the upper ends of the two sides 444 of the baffle plate 44 (the sides that are perpendicular to the bottom surface of the power converter 60) are fixed on the bottom surface of the power converter 60, that is, the bottom surface 62 of the housing, by, for example, welding, brazing, or screwing.

The baffle plate 44 is not limited to being C-shaped, and it is sufficient if it has a surface in a direction that is parallel to the bottom surface of the power converter 60, that is, the bottom surface 62 of the housing, and perpendicular to a flow of cooling air.

Figure 9:
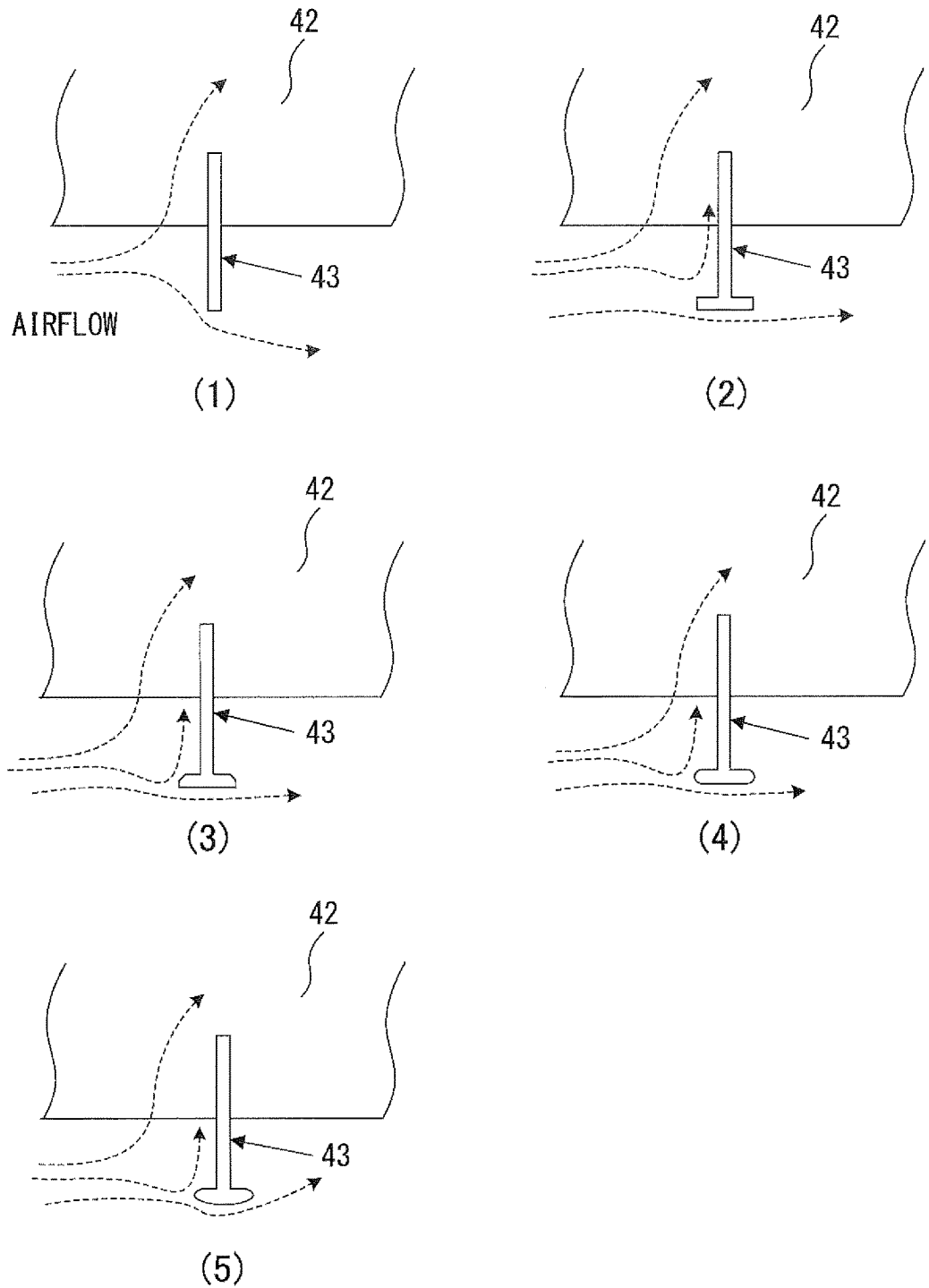
FIG. 9 illustrates cross-sectional front views of a plurality of exemplary configurations of the first baffle plate according to the first embodiment of the present disclosure.

FIG. 9 illustrates cross-sectional front views of a plurality of exemplary configurations of the baffle plate 43 according to the first embodiment of the present disclosure. In FIG. 9, the configuration of the baffle plate 43 is described using exemplary configurations (1) to (5). The configuration of the baffle plate 43 is described below, divided into several cases.

(1) The baffle plate 43 has an I-shaped cross section. As illustrated in FIG. 6D, the baffle plate 43 itself is configured to be comb-shaped, wherein each of the ends of the cooling fins 42 fits a slit between teeth of the comb.

As described above, the baffle plate 43 is provided at the ends of the cooling fins 42, which results in dividing, into two, a flow of cooling air that is flowing outside the cooling fins 42 (on the atmospheric side). One of the flows obtained by the division rises along the surface of the baffle plate 43 and is directed between the cooling fins 42. The other flow falls along the surface of the baffle plate 43 and is directed to outside the cooling fins 42 (to the atmospheric side).

(2) The baffle plate 43 has a T-shaped (convex) cross section. In other words, the cross section of the baffle plate 43 is constituted of the top part 431 and the leg part 432 of the T, which is similar to the cases of exemplary configurations (3) to (5) described later (see FIG. 6D).

The end of the leg part 432 of the T is comb-shaped, as illustrated in FIG. 6D, wherein each of the ends of the cooling fins 42 fits a slit between teeth of the comb.

In this exemplary configuration, the flow of cooling air is divided into three. The first flow becomes air that is directed between the cooling fins 42, the second flow becomes air that rises along the baffle plate 43 from the top part 431 of the T to the leg part 432 of the T and that is directed between the cooling fins 42, and the third flow becomes air that flows along the top part 431 of the T of the baffle plate 43 in the same direction as the outside air (the atmosphere).

(3) The baffle plate 43 is essentially configured to have a T-shaped (convex) cross section, as in the case of (2) described above. Both upper ends of the top part 431 of the T (on the side of the cooling fins 42) are chamfered.

In this exemplary configuration, the flow of cooling air is essentially the same as that in (2) described above. Due to both of the upper ends of the top part 431 of the T being chamfered, a fluid resistance is reduced, which results in reducing an airflow below the cooling fins 42, that is, into the side of outside air (into the atmosphere side), compared to when the top part 431 of the T has the shape of (2) described above. Further, an airflow (an amount of cooling air) that rises along the top part 431 of the T to the leg part 432 of the T and that is directed between the cooling fins 42 is increased.

(4) The baffle plate 43 is essentially configured to have a T-shaped (convex) cross section, as in the case of (3) described above. Both ends of the top part 431 of the T are processed into a semicircular shape.

In this exemplary configuration, the flow of cooling air is essentially the same as that in (3) described above. Due to both of the ends of the top part 431 of the T being semicircle-shaped, a fluid resistance is further reduced, compared to the case of (3) described above. Then, an airflow (an amount of cooling air) that rises along the top part 431 of the T to the leg part 432 of the T and that is directed between the cooling fins 42 is further increased.

(5) The baffle plate 43 is essentially configured to have a T-shaped (convex) cross section, as in the case of (4) described above, and both upper ends of the top part 431 of the T (on the side of the cooling fins 42) are chamfered. Further, the bottom surface of the top part 431 of the T is processed into a streamlined shape.

Accordingly, air that is flowing below the top part 431 of the T is directed between the cooling fins 42 situated backward after it passes through the baffle plate 43. This makes it possible to direct low-temperature air (atmosphere) between the backward cooling fins 42 as cooling air.

Figure 10A:
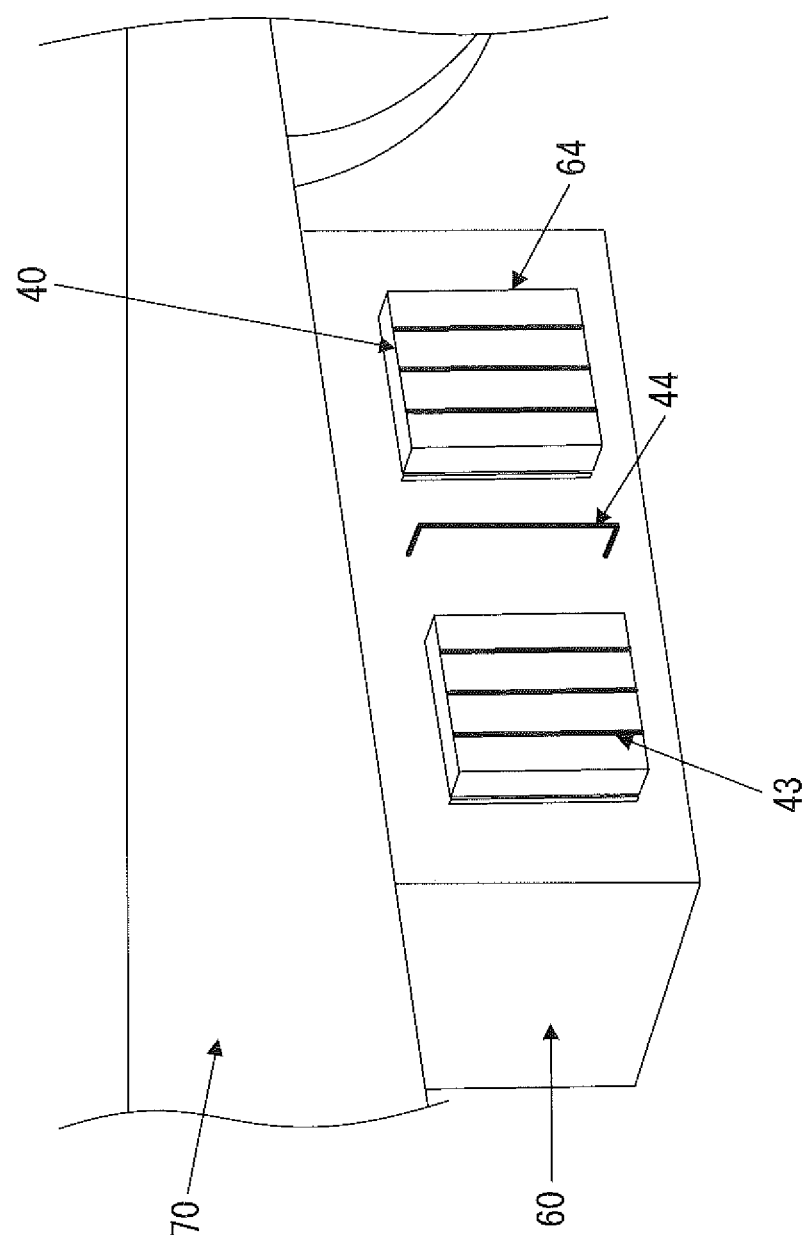
FIGS. 10A and 10B are diagrams that illustrate how the coolers and the baffle plates are provided in the power converter according to a second embodiment of the present disclosure.
Figure 10B:
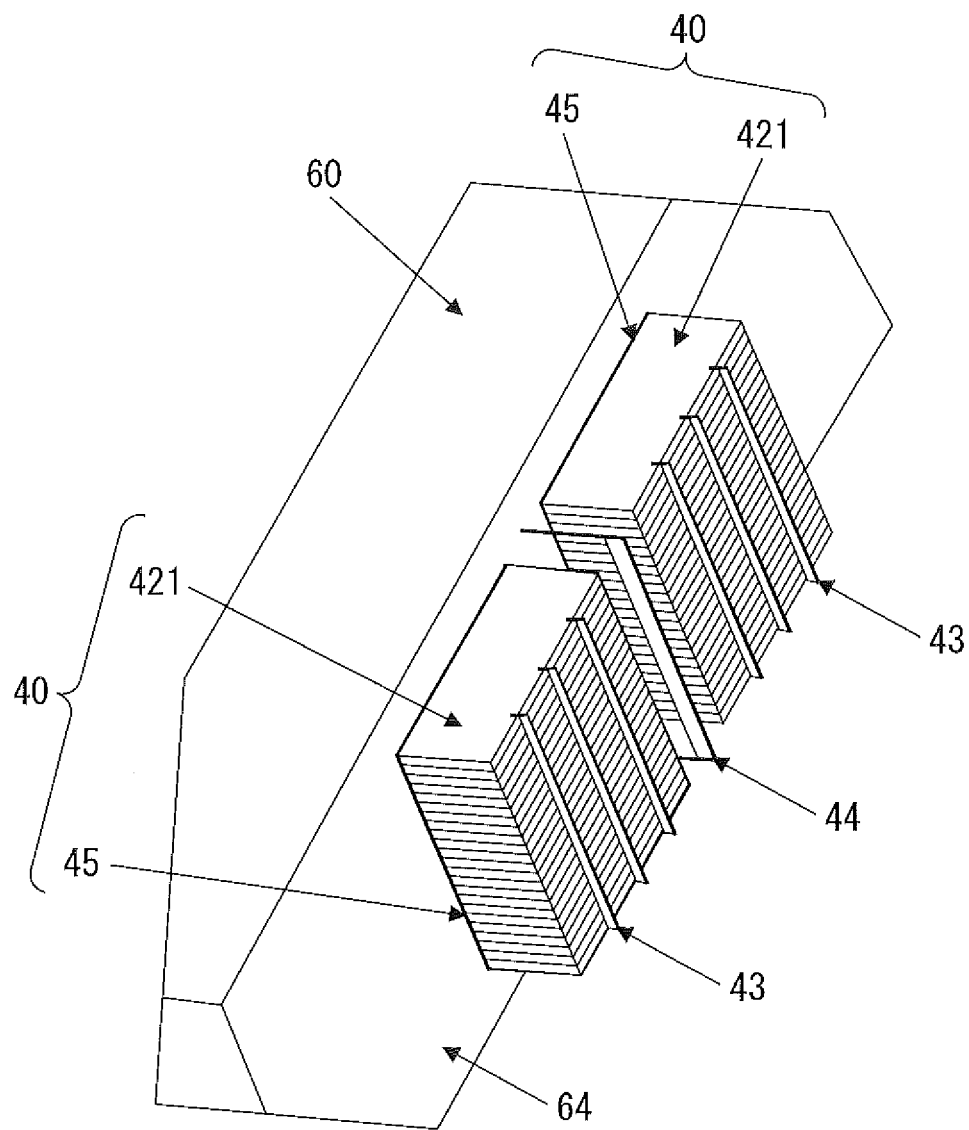

FIGS. 10A and 10B are diagrams that explain how the coolers and the baffle plates are provided in the power converter according to a second embodiment of the present disclosure.

FIG. 10A is a perspective view of an exemplary configuration in which two coolers 40 are mounted on a side surface of the power converter 60 that is arranged under the floor of a railroad vehicle and accommodated in the rectangular-parallelepiped-shaped housing. The two coolers 40 each include the heat receiving plate 45 and cooling fins 421 and are arranged along a course in which cooling air flows.

The cooling fins 421 of each of the coolers 40 protrude from the side surface of the power converter 60 into the atmosphere side, the power converter 60 being accommodated in the rectangular-parallelepiped-shaped housing. Here, the side surface is a surface of the rectangular-parallelepiped-shaped housing that is perpendicular to a direction in which the railroad vehicle travels (a surface on the side surface side of its vehicle body), wherein the power converter 60 is accommodated in the rectangular-parallelepiped-shaped housing.

FIG. 10B is an enlarged perspective view that illustrates how the cooler 40 of FIG. 10A is mounted, as viewed from the upper right side of the vehicle body 70 so as to see a side surface 64 of the housing of FIG. 10A.

In the present embodiment, the cooler 40 of the power converter 60 is provided with the baffle plate 43 (the first baffle plate) and the baffle plate 44 (the second baffle plate), and the baffle plate 44 is provided between two coolers 40.

The cooling fins 421 are mounted on the other surface of the heat receiving plate 45 by, for example, swaging or brazing, the heat receiving plate 45 being provided on the side surface side of the power converter 60 accommodated in the rectangular-parallelepiped-shaped housing. The cooling fins 421 can be provided on the other side surface side of the power converter 60 accommodated in the rectangular-parallelepiped-shaped housing.

The two coolers 40 that each include the cooling fins 421 are mounted on the side surface of the power converter 60 along a course in which cooling air flows. Like the cooling fin 42 illustrated in FIGS. 6A to 6D, the cooling fins 421 are rectangular-plate-shaped fins.

Like the cooling fins 42 illustrated in FIGS. 6A to 6D, the baffle plate 43 (the first baffle plate) that has a T-shaped cross section is provided in the cooling fins 421. The baffle plate 44 (the second baffle plate) is provided between the cooling fins 42 of the two coolers 40. The end of the baffle plate 44 protrudes laterally (into the atmospheric side) beyond the ends of the cooling fins 421.

In FIG. 10B, three baffle plates 43 are provided in cooling fins 421 of each cooler, but the number of baffle plates 43 provided in the cooling fins 42 is just an example, and it is not limited to this example.

As described above, the baffle plates 43 and 44 are provided in the cooling fins 421 that protrude from the side surface of the power converter 60 that is arranged under the floor of the railroad vehicle and accommodated in the rectangular-parallelepiped-shaped housing, so as to lead cooling air effectively between cooling fins 421. This configuration makes it possible to lead low-temperature air in a direction of the base of the cooling fins 421.

Figure 11:
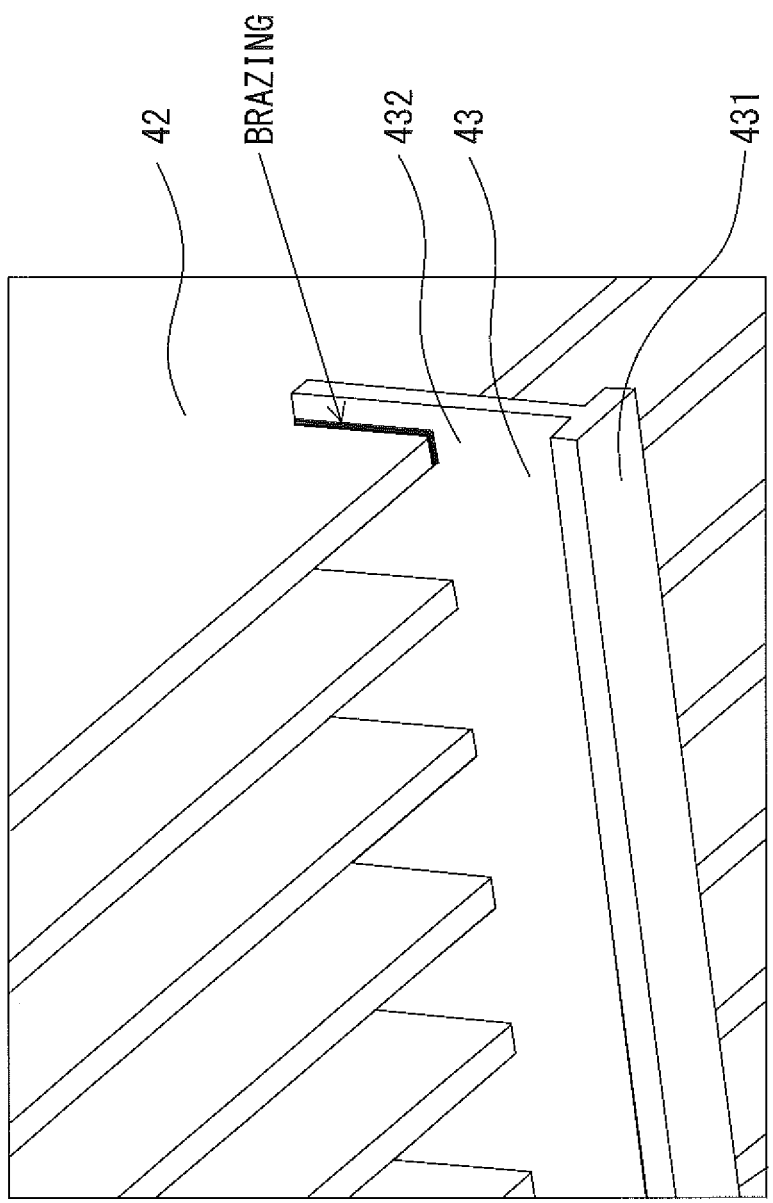
FIG. 11 is a perspective view that illustrates a method for providing the first baffle plate (Part 1)

FIG. 11 is a perspective view that illustrates a method for providing the baffle plate 43 according to the first and second embodiments of the present disclosure (Part 1). FIG. 11 illustrates an example in which the leg part 432 of the T of the baffle plate 43 is fixed on the outermost cooling fins 42 by brazing, as the cooling fins 42 are viewed from below the baffle plate 43. Brazing is just an example, and they may be fixed by, for example, welding instead of brazing.

Figure 12B:
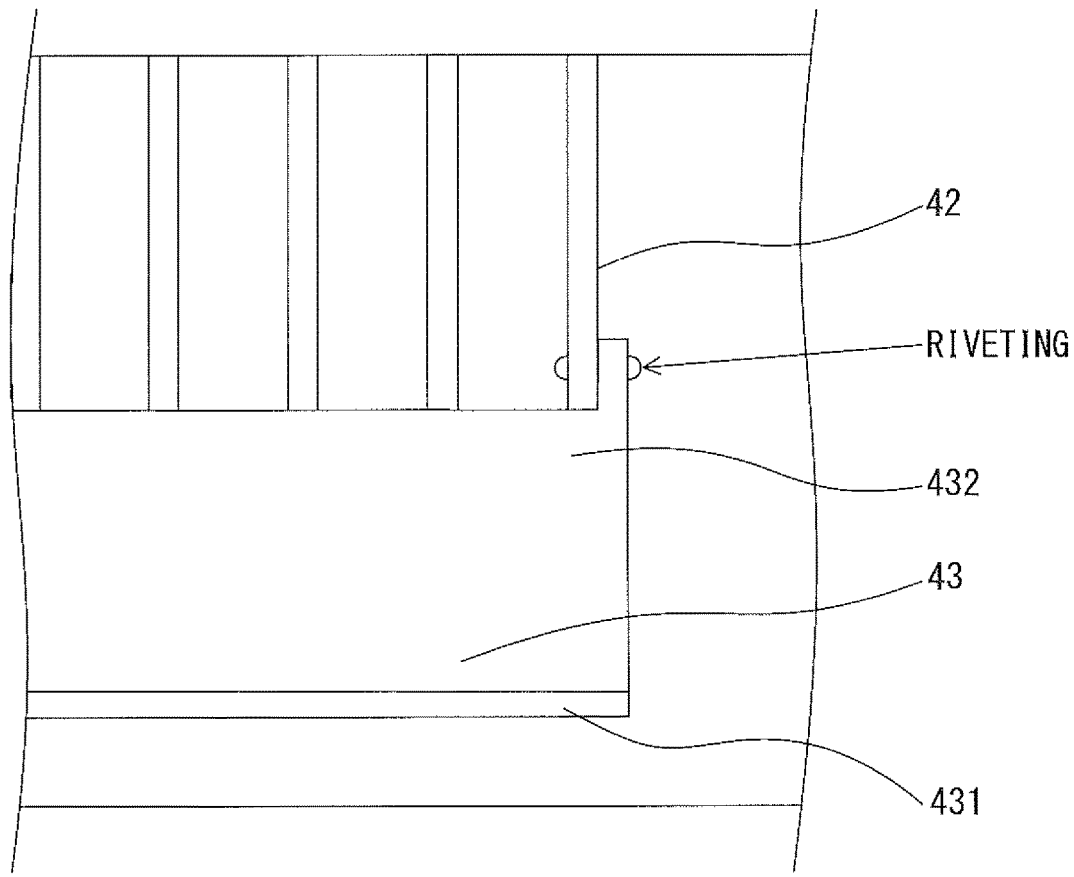

FIGS. 12A and 12B are diagrams that illustrate the method for providing a baffle plate 43 according to the first and second embodiments of the present disclosure (Part 2). In FIG. 12A, the ends of the cooling fins 42 are viewed from below the baffle plate 43, as in FIG. 11, and each of the ends of the cooling fins 42 fits a slit on the side of the leg part 432 of the T of the baffle plate 43, and as indicated by the front view of FIG. 11B, the leg part 432 of the T of the baffle plate 43 is fixed on the outermost cooling fins 42 by riveting. Riveting is just an example, and they may be fixed by, for example, screwing instead of riveting.

The embodiments of the present disclosure have been described above, but they are not limited to a cooling structure of a power converter mounted under the floor of a railroad vehicle. The cooling structure of the present disclosure is also applicable to a power converter provided in a vehicle other than the railroad vehicle.

The cooling structure of the present disclosure is also applicable to any power converter installed indoors or outdoors.

Even if the cooling structure of the present disclosure is applied to any of the power converters, it is possible to lead cooling air between cooling fins and to lead low-temperature air that is flowing outside the cooling fins between the cooling fins.

INDUSTRIAL APPLICABILITY

The application of the present disclosure is not limited to the cooling structure of a power converter for a vehicle such as a railroad vehicle, but it is applicable to any cooling structure of a power converter installed indoors or outdoors.

What is claimed is:

1. A power converter, comprising:
a heat generating element; and
a cooler that includes
a heat receiving plate,
a plurality of cooling fins, and a baffle plate, wherein
the heat generating element and the plurality of cooling fins are respectively mounted on two different surfaces of the heat receiving plate,
each cooling fin is a plate of a rectangular shape, and the plurality of cooling fins are arranged in parallel to one another, surfaces of any adjacent two of the cooling fins forming a space therebetween that defines a course for cooling air to flow therethrough, and
the baffle plate is provided across the plurality of cooling fins, and has a substantially rectangular surface in a plane perpendicular to a direction of the courses, the substantially rectangular surface including a top portion that is within the spaces formed by the cooling fins, and a bottom portion that is in an atmosphere outside the cooling fins and the spaces.

2. The power converter according to claim 1, wherein the baffle plate
has a cross section of an I-shape, and
includes a plurality of concavities at which the plurality of cooling fins respectively intersect the baffle plate.

3. The power converter according to claim 1, wherein the baffle plate
has a cross section of a T-shape, which includes a top part and a leg part, and
includes, at an end of the leg part, a plurality of concavities at which the plurality of cooling fins respectively intersect the baffle plate.

4. The power converter according to claim 3, wherein the top part is chamfered on a side on which the leg part connects the top part.

5. The power converter according to claim 3, wherein each of two ends of the top part is of a semicircle shape.

6. The power converter according to claim 3, wherein the top part is of a streamline shape.

7. The power converter according to claim 1, wherein two ends of the baffle plate are respectively fixed on two outermost ones of the cooling fins by brazing, welding, riveting or screwing.

8. The power converter according to claim 1, wherein the surface of the baffle plate extends beyond two outermost ones of the cooling fins.

9. A cooling structure of a power converter, comprising:
a plurality of coolers, each including
a heat receiving plate,
a plurality of cooling fins mounted on the heat receiving plate, and
a first baffle plate provided across the plurality of cooling fins; and
a second baffle plate provided between two of the plurality of coolers, wherein
each cooling fin is a plate of a rectangular shape, and the plurality of cooling fins in each cooler are arranged in parallel to one another, surfaces of any adjacent two of the cooling fins forming a space therebetween that defines a course for cooling air to flow therethrough,
each of the first baffle plates and the second baffle plate has a substantially rectangular surface in a plane perpendicular to a direction of the courses, and
the substantially rectangular surface of each first baffle plate includes a top portion that is within the spaces formed by the cooling fins, and a bottom portion that is in an atmosphere outside the cooling fins and the spaces.

10. The cooling structure according to claim 9, wherein the second baffle plate has an I-shaped cross section.

11. The cooling structure according to claim 9, wherein the second baffle plate has a T-shaped cross section.

12. The cooling structure according to claim 9, wherein the surface of the second baffle plate extends beyond the surfaces of outermost ones of the cooling fins.

13. A cooling structure for a power converter of a railroad vehicle, comprising:
a housing of a rectangular parallelepiped shape; and
a cooler mounted under a floor of the railroad vehicle and accommodated in the housing, the cooler including
a heat receiving plate,
a plurality of cooling fins mounted on the heat receiving plate, and
a baffle plate provided across the plurality of cooling fins, wherein
each cooling fin is a plate of a rectangular shape, and the plurality of cooling fins are arranged in parallel to one another, surfaces of any adjacent two of the cooling fins forming a space therebetween that defines a course for cooling air to flow therethrough, and
the baffle plate has a substantially rectangular surface in a plane perpendicular to a direction of the courses, the substantially rectangular surface including a top portion that is within the spaces formed by the cooling fins, and a bottom portion that is in an atmosphere outside the cooling fins and the spaces.

14. The cooling structure according to claim 13, wherein the cooling fins are arranged on a bottom surface of the rectangular parallelepiped shape so as to be oriented downward with respect to the railroad vehicle.

15. The cooling structure according to claim 13, wherein the cooling fins are arranged on a bottom surface of the rectangular parallelepiped shape so as to be oriented toward the floor of the railroad vehicle.

16. The cooling structure according to claim 13, wherein the cooling fins are arranged on a surface side of the rectangular parallelepiped shape so as to be oriented in a lateral direction of the railroad vehicle, the lateral direction being parallel to a direction in which the railroad vehicle travels.

17. The cooling structure according to claim 16, wherein the cooling fins are arranged so as to be oriented in one of two lateral directions of the railroad vehicle, the two lateral directions being parallel to the direction in which the railroad vehicle travels.

* * * * *